United States Patent [19]
Lynch et al.

[11] Patent Number: 5,646,218
[45] Date of Patent: Jul. 8, 1997

[54] NOVOLAK RESIN BLENDS FOR PHOTORESIST APPLICATIONS

[75] Inventors: Thomas J. Lynch, North Easton, Mass.; Chester J. Sobodacha, Coventry; Dana L. Durham, East Greenwich, both of R.I.

[73] Assignee: Hoechst-Celanese Corp., Somerville, N.J.

[21] Appl. No.: 692,306

[22] Filed: Aug. 5, 1996

Related U.S. Application Data

[60] Continuation of Ser. No. 304,317, Sep. 12, 1994, abandoned, which is a division of Ser. No. 996,924, Dec. 29, 1992, Pat. No. 5,374,693.

[51] Int. Cl.$^6$ .................. C08F 283/00; C08G 8/28; C08L 61/00; C08L 61/06
[52] U.S. Cl. .................. 525/501; 528/129; 528/230; 528/232; 430/192
[58] Field of Search .................. 430/192; 525/501; 528/129, 230, 232

[56] References Cited

U.S. PATENT DOCUMENTS 4,988,601  1/1991  Ushirogouchi et al. .................. 430/192

Primary Examiner—James J. Seidleck
Assistant Examiner—Duc Truong

[57] ABSTRACT

The present invention relates to a water insoluble, aqueous alkali soluble novolak resin blend, wherein the resin blend comprises two novolaks having dissimilar relative molecular weights and similar dissolution rates, a process for producing such a resin blend, a photoresist containing such a resin blend and a method for producing a semi-conductor device utilizing such a photoresist.

27 Claims, 5 Drawing Sheets

NOVOLAK RESIN BLENDS FOR PHOTORESIST APPLICATIONS

This is a continuation of application Ser. No. 304,317 filed Sep. 12, 1994, now abandoned, which is a division of 07/996,924 filed Dec. 29, 1992 now U.S. Pat. No. 5,374,693.

BACKGROUND OF THE INVENTION

The present invention relates to a mixture of novolak resins having different relative molecular weights and similar dissolution rates and their use in light-sensitive compositions. The present invention also relates to light-sensitive compositions useful in positive-working photoresist compositions. Further, the present invention relates to substrates coated with these light-sensitive compositions as well as the process of coating, imaging and developing these light-sensitive mixtures on these substrates.

Photoresist compositions are used in micro-lithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of one micron or less are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to mixtures of novolak resins having similar dissolution rates, but dissimilar relative molecular weights and their use in photoresist compositions. The invention further relates to positive-working photoresists containing these novolak resin blends and a photosensitizer, and the use of such photoresists in producing semiconductor devices.

One of the problems with the production of novolak resins suitable for use in photoresist compositions has been that it was difficult to produce resins which were consistent from batch to batch. This inconsistency often led to unsatisfactory lithographic properties in the final photoresist. This inconsistency was overcome, to some extent, by blending several batches of novolak resin to provide photoresist formulations that were reasonably consistent. The present invention relates to the mixing of novolak resins having dissimilar relative molecular weights and similar dissolution rates to provide a novolak resin blend that is useful for providing photoresist compositions having improved and consistent lithographic properties.

The present invention relates to the surprising discovery that an improved novolak resin for use in photoresist compositions is obtained by utilizing a mixture of novolak resins having dissimilar relative molecular weights and similar dissolution rates. The relative molecular weights of the two resins differ by more than about 5%, preferably more than about 10%, more preferably from about 10% to 60%, and most preferably from about 25% to about 50%. The dissolution rates differ by less 2.0, preferably less than about 1.5, more preferably less than about 1.0 and most preferably less than about 0.5.

The lithographic performance ("L") of the photoresist, in terms of depth of focus and exposure latitude equals $RMW_a - RMW_b / DR_a - DR_b$, where RMW is the relative molecular weight and DR is the dissolution rate. L is greater than or equal to 2.0, preferably $\geq 4.0$, more preferably $\geq 26.0$ and most preferably a large difference in relative molecular weight and a small difference in dissolution rate provides a higher lithographic performance.

The subject invention provides a water insoluble, aqueous alkali soluble film forming novolak resin blend which comprises a mixture of at least two novolak resins, with the same or different chemical composition, for which the relative molecular weights differ by more than 5% and for which the dissulution rates differ by less than 2.0.

The present invention also relates to a process for providing a water insoluble, aqueous alkali soluble, film forming novolak resin blend which is useful for making a substantially uniform photoresist composition, by mixing at least two novolak resins, with the same or different chemical composition, for which the relative molecular weights differ by more than 5% and for which the dissolution rates differ by less than 2.0.

The invention also provides a process for producing a positive photoresist composition comprising providing an admixture of:

a) a photosensitive component in an amount sufficient to uniformly photosensitize the photoresist composition; and b) a water insoluble, aqueous alkali soluble novolak resin comprising a mixture of at least two novolak resins, within the same or different chemical composition, for which the relative molecular weights differ by more than 5% and for which the dissolution rates differ by less than 2.0, the novolak resin blend being present in the photoresist composition in an amount sufficient to form a substantially uniform photoresist composition; and c) a suitable solvent.

The invention further provides a method for producing a semiconductor device by producing a photoresist image on a substrate by coating a suitable substrate with a positive working photoresist composition by providing an admixture of:

a) a photosensitive component in an amount sufficient to photosensitize the photoresist composition;

b) a water insoluble, aqueous alkali soluble novolak resin comprising a mixture of at least two novolak resins, with the same or different chemical composition, for which the relative molecular weights differ by more than 5% and for which the dissolution rates differ by less than 2.0 the novolak resin blend being present in the photoresist composition in an amount sufficient to form a substantially uniform photoresist composition; and c) a suitable solvent; then heat treating the coated substrate until substantially all of the solvent is removed; image-wise exposing the photosensitive composition; and removing the image-wise exposed areas of such composition with an aqueous alkaline developer. Optionally one may perform a baking of the substrate either immediately before or after the removing step.

DETAILED DESCRIPTION OF THE PREFERRED EMBODIMENTS

Figure 1:
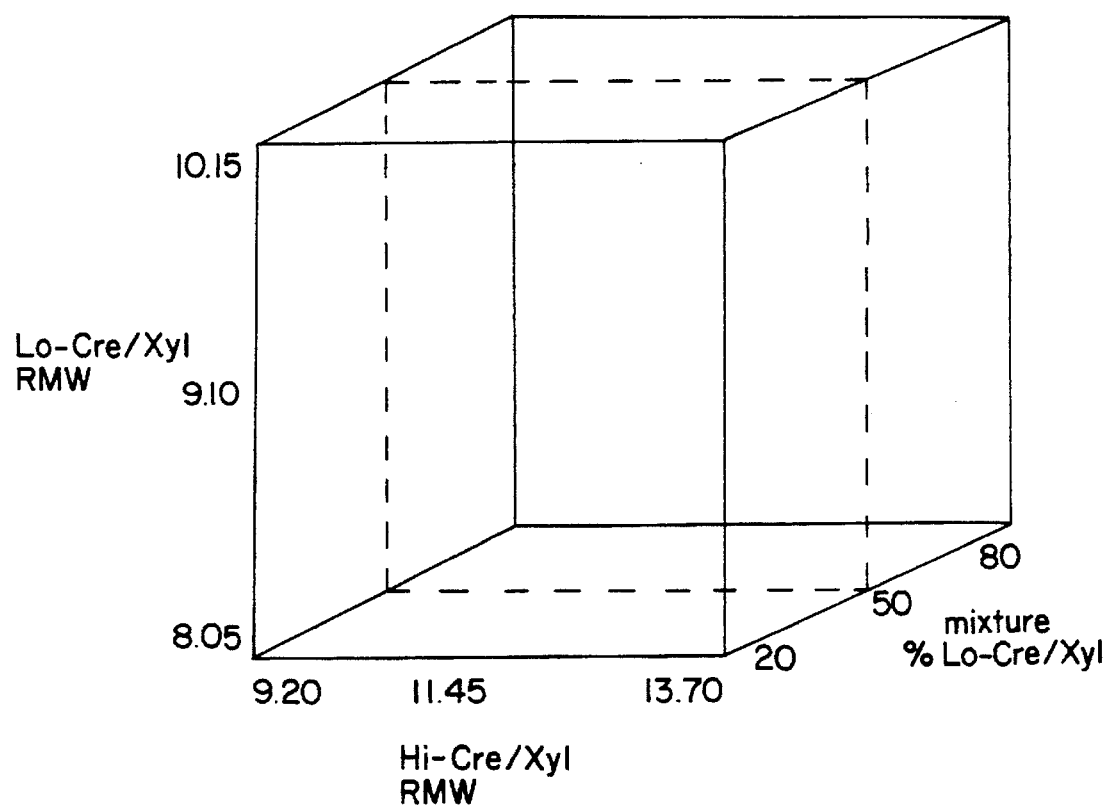

In the production of the relief image of the present invention, one coats and dries the foregoing photoresist composition on a suitable substrate.

Novolak resins have been commonly used in the art of photoresist manufacture as exemplified by "Chemistry and Application of Phenolic Resins", Knop A. And Scheib, W.; Springer Verlag, New York, 1979 in Chapter 4. Similarly, o-quinone diazides are well known to the skilled artisan as demonstrated by "Light Sensitive Systems", Kosar, J.; John Wiley & Sons, New York, 1965 Chapter 7.4. However, the instant invention has found that the use of particular novolak resin blends, as opposed to those taught in the prior art, produces a photoresist having excellent depth of focus and exposure latitude.

The novolak resins utilized in providing the novolak resin blends of the present invention may be provided by forming an admixture of formaldehyde and one or more phenolic compounds, such as meta-cresol (m-cresol), para-cresol (p-cresol), 3,5-xylenol and 3,4-xylenol and a catalytic amount of a suitable catalyst, preferably an acid catalyst such as oxalic acod or maleic anhydride, and heating the mixture at a temperature from about 60° C. to about 150° C. for a period of from about 1 hour to about 12 hours.

The sensitizer which comprises a component of the photoresist composition of the present invention may be an ester of one or more multihydroxy phenolic or alcoholic compound, preferably a hydroxybenzophenone, and a sulfonic acid or sulfonic acid derivative such as a sulfonyl chloride. Examples of such sensitizers are described in U.S. Pat. Nos. 3,106,465 and 4,719,167, which are incorporated herein by reference.

The photoresist composition is formed by blending the ingredients in a suitable solvent. In the preferred embodiment, the amount of novolak resin blend in the photoresist preferably ranges from 60% to about 95% and more preferably from about 70% to about 90% based on the weight of the solid; i.e., non-solvent, photoresist components. In the preferred embodiment, the photosensitizer is present in the photoresist in an amount of from about 5% to about 40% preferably from about 10% to about 30% based on the weight of the solid photoresist components. In producing the photoresist composition, the novolak resin blend and sensitizer are mixed with such solvents as propylene glycol mono-alkyl ether, propylene glycol alkyl ether acetate, butyl acetate, xylene, ethylene glycol monoethyl ether acetate, propylene glycol mono-methyl ether acetate, ethyl lactate, ethyl-3-ethoxypropionate, and mixtures of ethyl lactate and ethyl-3-ethoxypropionate, among others.

Other optional ingredients such as colorants, dyes, anti-striation agents, leveling agents, plasticizers, adhesion promoters, speed enhancers, solvents and such surfactants as non-ionic surfactants may be added to the solution of novolak resin blend, sensitizer and solvent before the solution is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)- ethyltrimethoxysilane; 1,1,1,3,3,3-hexamethyl disilazane p-methyl-disilane-methyl methacrylate; vinyltrichlorosilane; and gamma-amino-propyl triethoxysilane up to about a 4 percent weight level, based on the combined weight of resin and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of resin and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Process for Making a Low M-Cresol/3,5-Xylenol (Lo-Cre/Xyl) Novolak with a Low Relative Molecular Weight M-cresol (162 g), 3,5-xylenol (110 g), diglyme (300 g), formaldehyde (37.3% in water, 290 g) and oxalic acid (0.54 g) were combined in a 2 liter flask and then heated at 95° C. for one hour. A mixture of m-cresol (162 g) and 3,5-xylenol (110 g) were added to the reaction mixture over one hour. Heating at 95° C. was continued for three hours. The volatile components were distilled away from the reaction mixture until the residue was at 200° C. Vacuum was applied slowly to the distillation until 35 mmHg and 220° C. were both reached and held for 15 minutes. The novolak resin in the reaction flask was then cooled to room temperature. RMW= 8.1; DR=5.44.

EXAMPLE 2

Process for Making a Lo-Cre/Xyl Novolak with an intermediate Relative Molecular Weight M-cresol (338 g), 3,5-xylenol (229 g), diglyme (625 g), formaldehyde (37.3% in water, 603 g) and oxalic acid (1.13 g) were combined in a 5 liter flask and then heated at 95° C. for one hour. A mixture of m-cresol (338 g) and 3,5-xylenol (229 g) were added to the reaction mixture over one hour. Heating at 95° C. was continued for four hours. The volatile components were distilled away from the reaction mixture until the residue was at 200° C. Vacuum was applied slowly to the distillation until 35 mmHg and 220° C. were both reached. The novolak resin in the reaction flask was then cooled to room temperature. RMW=9.0; DR=2.88.

EXAMPLE 3

Process for Making a Lo-Cre/Xyl Novolak with a High Relative Molecular Weight

M-cresol (162 g), 3,5-xylenol (110 g), diglyme (300 g), formaldehyde (37.3% in water, 348 g) and oxalic acid (0.54 g) were combined in a 2 liter flask and then heated at 95° C. for one hour. A mixture of m-cresol (162 g) and 3,5-xylenol (110 g) were added to the reaction mixture over one hour. Heating at 95° C. was continued for two hours. The volatile components were distilled away from the reaction mixture until the residue was at 200° C. Vacuum was applied slowly to the distillation until 35 mmHg and 220° C. were both reached and held for 15 minutes. The novolak resin in the reaction flask was then cooled to room temperature. RMW=10.2; DR=1.63.

EXAMPLE 4

Process for Making a Hi-Cre/Xyl Novolak with a Low Relative Molecular Weight

M-cresol (114 g), 3,5-xylenol (42.8 g), diglyme (50.0), and maleic anhydride (3.13 g) were combined in a flask and heated to 95° C. The solution was purged with nitrogen for 3 minutes. Formaldehyde (37.2% in water, 83.7 g) was added slowly over 75 minutes. Heating at 95° C. was continued for four hours. The volatile components were distilled away from the reaction mixture until the residue was at 200° C. Vacuum was applied slowly to the distillation until 35 mmHg and 220° C. were both reached. The novolak resin in the reaction flask was then cooled to room temperature. RMW=9.2; DR=10.4.

EXAMPLE 5

Process for Making a High Relative Molecular Weight Novolak

M-cresol (113 g), 3,5-xylenol (42.8 g), diglyme (70.0 g), and maleic anhydride (3.13 g) were combined in a flask and heated to 95° C. The solution was purged with nitrogen for 3 minutes. Formaldehyde (37.2% in water, 87.1 g) was added slowly over 75 minutes. Heating at 95° C. was continued for four hours. The volatile components were distilled away from the reaction mixture until the residue was at 200° C. Vacuum was applied slowly to the distillation until 35 mmHg and 220° C. were both reached. The novolak resin in the reaction flask was then cooled to room temperature. RMW=11.4; DR=4.14.

EXAMPLE 6

Process for Making a High Relative Molecular Weight Novolak

M-cresol (113 g), 3,5-xylenol (42.8 g), diglyme (90.0 g), and maleic anhydride (3.13 g) were combined in a flask and heated to 95° C. The solution was purged with nitrogen for 3 minutes. Formaldehyde (37.2% in water, 90.5 g) was added slowly over 75 minutes. Heating at 95° C. was continued for four hours. The volatile components were distilled away from the reaction mixture until the residue was at 200° C. Vacuum was applied slowly to the distillation until 35 mmHg and 220° C. were both reached. The novolak resin in the reaction flask was then cooled to room temperature. RMW=13.7; DR=2.31.

TABLE 1

RMW's and DR's of Six Novolak Resins

| | Novolac | RMW | DR |
|---|---|---|---|
| Example 1 | Lo-Cre/Xyl | 8.1 | 5.44 |
| Example 2 | Lo-Cre/Xyl | 9.0 | 2.88 |
| Example 3 | Lo-Cre/Xyl | 10.2 | 1.63 |
| Example 4 | Hi-Cre/Xyl | 9.2 | 10.4 |
| Example 5 | Hi-Cre/Xyl | 11.4 | 4.14 |
| Example 6 | Hi-Cre/Xyl | 13.7 | 2.31 |

EXAMPLES 7–26

A novolak resin blend was prepared by combining the Lo-Cre/Xyl novolak resin of Example 1 with the Hi-Cre/Xyl novolak resin of Example 4. Both novolaks were dissolved in 150 mL of propylene glycol methyl ether acetate with 0.02% surfactant (FC-430 available from 3M Corp.). Table 2 shows the two novolak components and the percent of each that was used to formulate Examples 7–26.

TABLE 2

Novolak Resin Blends
Low-Cre/Xyl Resin Mixed with Hi-Cre/Xyl Resin

| Example | Lo-Cre/Xyl RMW | Hi-Cre/Xyl RMW | Mixture % Lo-Cre/Xyl | Mixture % Hi-Cre/Xyl | DR μm/min |
|---|---|---|---|---|---|
| 7 | 8.05 | 9.20 | 20 | 80 | 7.88 |
| 8 | 10.15 | 9.20 | 20 | 80 | 6.29 |
| 9 | 8.05 | 13.70 | 20 | 80 | 2.99 |
| 10 | 10.15 | 13.70 | 20 | 80 | 2.21 |
| 11 | 8.05 | 9.20 | 80 | 20 | 5.38 |
| 12 | 10.15 | 9.20 | 80 | 20 | 2.60 |
| 13 | 8.05 | 13.70 | 80 | 20 | 4.83 |
| 14 | 10.15 | 13.70 | 80 | 20 | 1.88 |
| 15 | 8.05 | 11.45 | 50 | 50 | 5.10 |
| 16 | 10.15 | 11.45 | 50 | 50 | 2.78 |
| 17 | 9.10 | 9.20 | 50 | 50 | 5.76 |
| 18 | 9.10 | 13.70 | 50 | 50 | 2.81 |
| 19 | 9.10 | 11.45 | 20 | 80 | 3.99 |
| 20 | 9.10 | 11.45 | 80 | 20 | 2.94 |
| 21 | 9.10 | 11.45 | 50 | 50 | 3.62 |
| 22 | 9.10 | 11.45 | 50 | 50 | 3.29 |
| 23 | 9.10 | 11.45 | 50 | 50 | 3.09 |
| 24 | 9.10 | 11.45 | 50 | 50 | 3.24 |
| 25 | 9.10 | 11.45 | 50 | 50 | 3.45 |
| 26 | 9.10 | 11.45 | 50 | 50 | 3.36 |

EXAMPLE 27

Dissolution Rate Procedure for Novolak Resins Formulations:

Dissolve 26% resin solids in propylene glycol methyl ether acetate (PGMEA). Filter through a 0.2 μm disposable Acrodisc filter.

Spin Speed Determinations for 1.5 μm Films:

For each sample, spin three wafers at the following speeds: 1500, 2500, and 3500 rpm/30 seconds. Bake all wafers at 90° C. for 30 minutes in a forced air oven. Measure film thickness at n=1.64 using a Rudolf Film Thickness Monitor and interpolate the speed required for 1.5 μm films by logarithmic (base 10) regression.

Dissolution Rate Procedure:

1. For each sample, spin coat 3 wafers at the appropriate speed to obtain 1.5 μm films.
2. Bake all wafers at 90±/–1° C. for 30 minutes.
3. Determine the thickness of each film, in μm, at n=1.64 using a Rudolf Film Thickness Monitor.
4. Develop all sample films individually with no agitation in 2.38% tetramethylammonuim hydroxide at 25±/–0.5° C. Film loss during development is monitored by interferometry using a XINIX End-Point Controller; the dissolution rate is calculated from the interferogram. The average dissolution for each sample is determined. Dissolution rates for Example 7–26 novolak blends are listed in Table 2.

EXAMPLE 28

Procedure for RMW Determination of Novolak Resin

Make a 7% solution of the resin (1.75 grams in 25.00 ml volumetric flask) in cyclohaxanone solvent. Filter the solution through a 5 micron membrane syringe filter. Fill a SIZE #100/ #200 viscometer in the inverse position to the second line. Place the viscometer in the viscosity bath at 25° C. (constant temperature) for 15–20 minutes. Take flow time of the resin solution (sec.) and repeat until two consistent readings are obtained. Check solvent flow time in the same manner.

CALCULATION:

$$RMW = [\log(\text{flow time of resin soln/solvent flow time})/\text{conc.} \ (0.07)]^2$$

EXAMPLE 29–48

A resist was made by dissolving 20 g of the novolak resin blend prepared in Examples 7–26 with 5 g of a photoactive compound composed of 30 wt. % 2,1,4- and 70 wt. % 2,1,5-diazonaphtoquinone esters of 1,1,1-Tris(4-hydroxyphenyl)ethane; 75 g propylene glycol methyl ether acetate was used as the solvent. 300 ppm of surfactant (FC-430 available from 3M Corp.) was added to prevent formation of striations in the spin cast film.

EXAMPLE 49

Generation of Lithographic Data

The photoresists prepared in Examples 29–48 were spin coated on four inch silicon wafers to give 1.29 micron films. The wafers were baked at 90° C. for 45 sec. A focus/exposure matrix was imaged onto the coated wafer using a Nikon i-line stepper with a uniform lines/spaces. Exposure energy was increased in one direction of the 21×21 exposure matrix while focus was varied in the opposite direction with optimum focus in the center. A 45 sec post-exposure bake was then followed by a 60 sec puddle development with a 2.38% aqueous tetramethylammonium hydroxide solution. Photoresist lines decayed on either side of the center optimum focus as the exposure dose increased. The larger the exposure/focus area of the matrix that retains lines after development, the greater the depth of focus and exposure latitude of the resist. The exposure/focus areas for Examples 29–48 are listed in Table 3.

TABLE 3

Photoresists from Novolak Resin Blends of Low-Cre/Xyl Resin and Hi-Cre/Xyl Resins

| Example | Lo-Cre/Xyl RMW | Hi-Cre/Xyl RMW | Mixture % Lo-Cre/Xyl | Mixture % Hi-Cre/Xyl | Exp/ Focus |
|---------|----------------|----------------|----------------------|----------------------|------------|
| 29 | 8.05 | 9.20 | 20 | 80 | 492 |
| 30 | 10.15 | 9.20 | 20 | 80 | 393 |
| 31 | 8.05 | 13.70 | 20 | 80 | 610 |
| 32 | 10.15 | 13.70 | 20 | 80 | 505 |
| 33 | 8.05 | 9.20 | 80 | 20 | 549 |
| 34 | 10.15 | 9.20 | 80 | 20 | 475 |
| 35 | 8.05 | 13.70 | 80 | 20 | 555 |
| 36 | 10.15 | 13.70 | 80 | 20 | 582 |
| 37 | 8.05 | 11.45 | 50 | 50 | 503 |
| 38 | 10.15 | 11.45 | 50 | 50 | 372 |
| 39 | 9.10 | 9.20 | 50 | 50 | 545 |
| 40 | 9.10 | 13.70 | 50 | 50 | 544 |
| 41 | 9.10 | 11.45 | 20 | 80 | 566 |
| 42 | 9.10 | 11.45 | 80 | 20 | 524 |
| 43 | 9.10 | 11.45 | 50 | 50 | 524 |
| 44 | 9.10 | 11.45 | 50 | 50 | 607 |
| 45 | 9.10 | 11.45 | 50 | 50 | 582 |
| 46 | 9.10 | 11.45 | 50 | 50 | 585 |
| 47 | 9.10 | 11.45 | 50 | 50 | 587 |
| 48 | 9.10 | 11.45 | 50 | 50 | 564 |

EXAMPLE 50

Examples 7–26 represent the corners, faces and center of the cube of FIG. 1 where the three axes are RMW of Lo-Cre/Xyl, the RMW of Hi-Cre/Xyl, and percent mix of Lo-Cre/Xyl -to- Hi-Cre/Xyl.

Figure 2A:
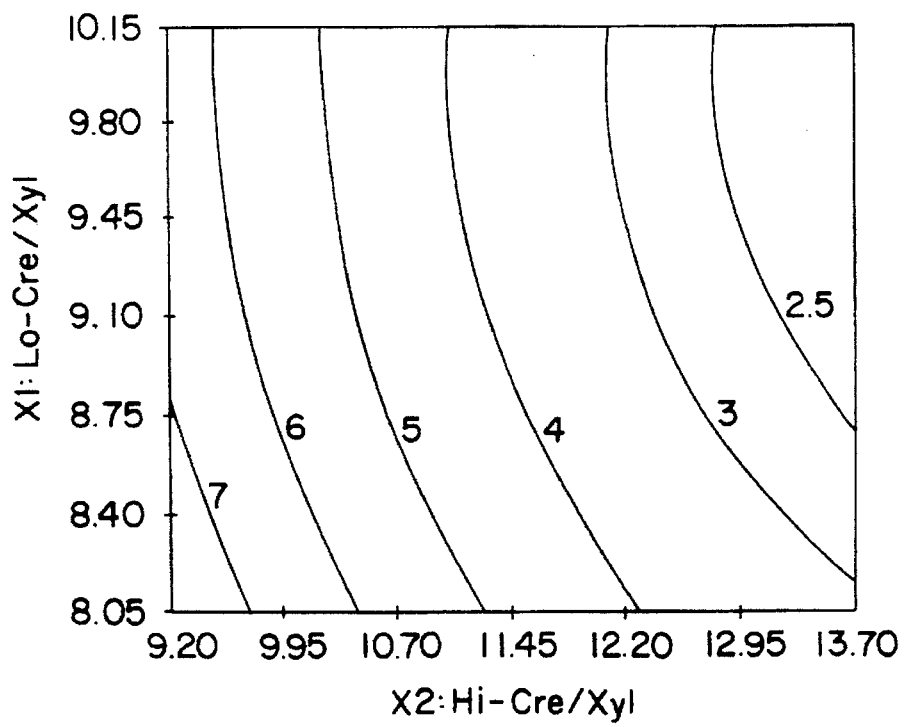
Figure 2B:
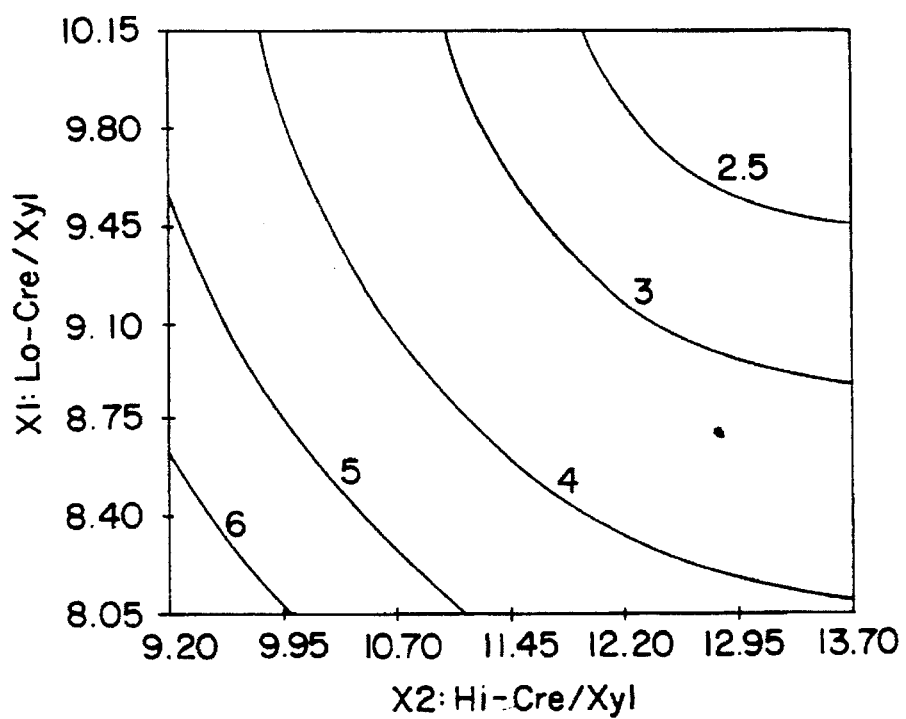
Figure 2C:
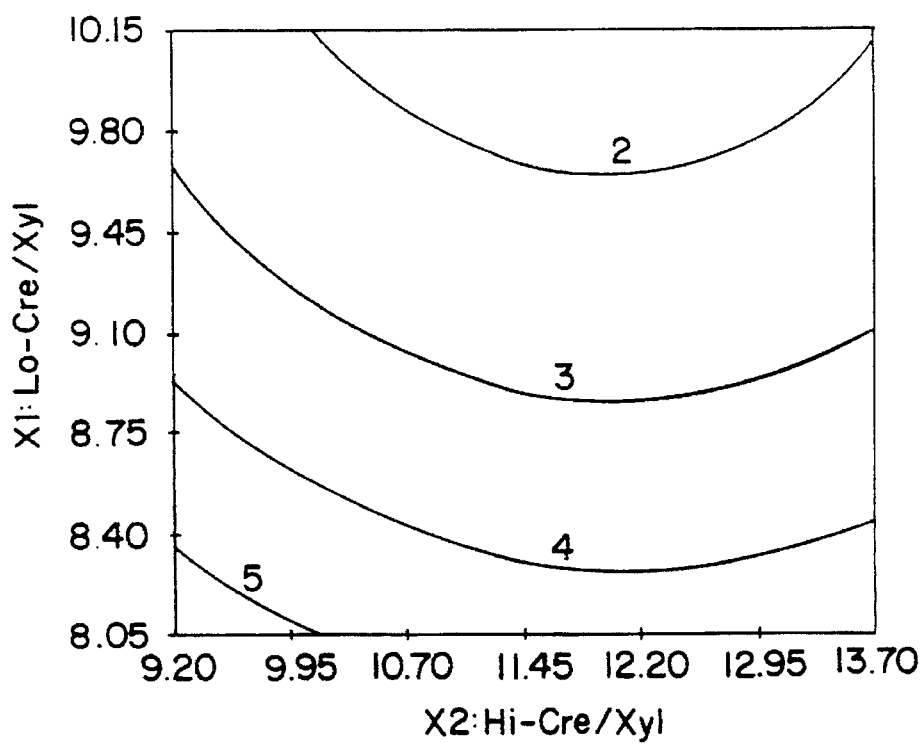

Dissolution rates of the twenty blended examples 7–26 were measured and used to generate the response surfaces in FIGS. 2a, 2b and 2c.

These response surfaces correspond to the front face, the center vertical plane, and the back face of the cube of FIG. 1. Examination of the contour plots shows that the DR's of the blends are predominantly controlled by the RMW of the individual novolaks. For example, the lowest DR correlates with the novolac blend with both the highest RMW's of the component novolacs. That is, at 80% of Lo-Cre/Xyl (FIG. 2c), the DR changes mostly as a function of the RMW of Lo-Cre/Xyl and is only weakly effected by the RMW of the Hi-Cre/Xyl. Conversely, at 80% of Hi-Cre/Xyl (FIG. 2a), the DR is controlled primarily by the RMW of Hi-Cre/Xyl.

EXAMPLE 51

Figure 3A:
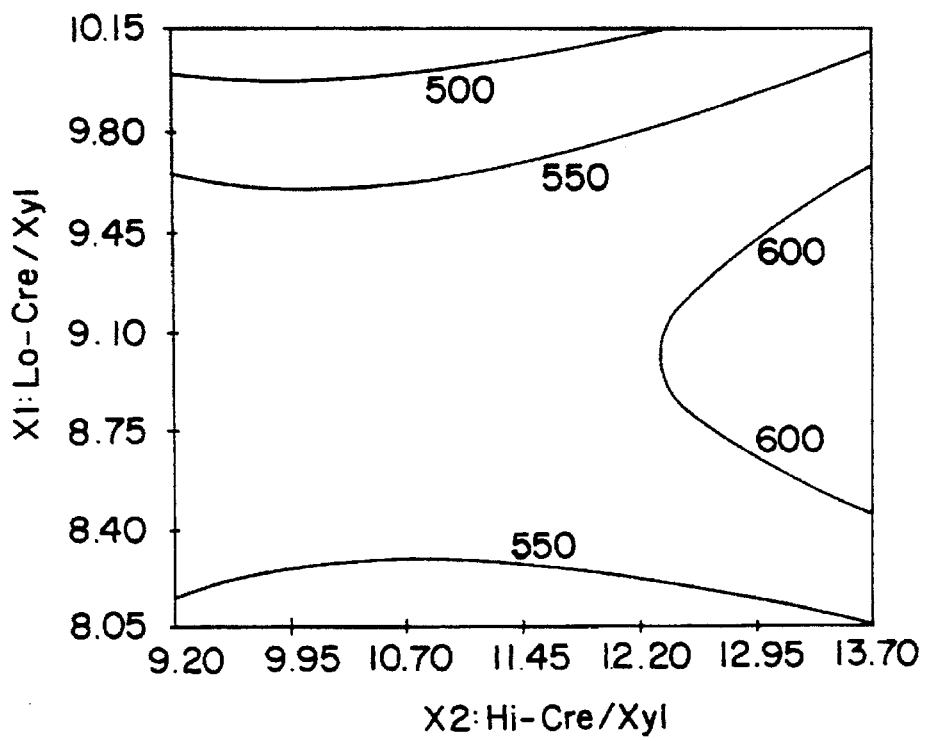
Figure 3B:
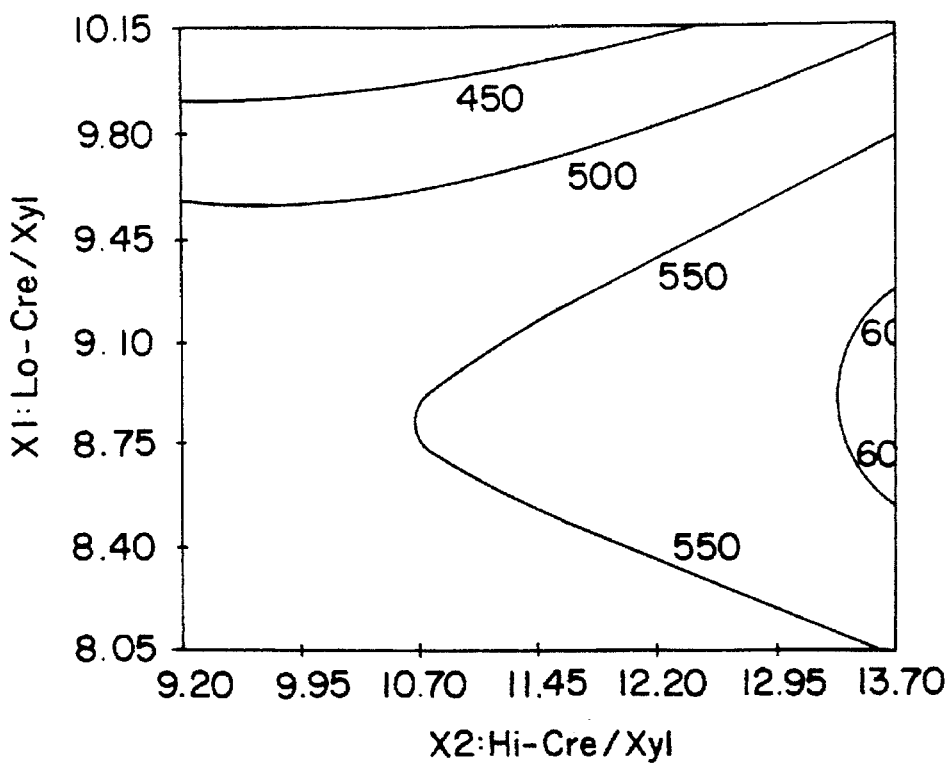
Figure 3C:
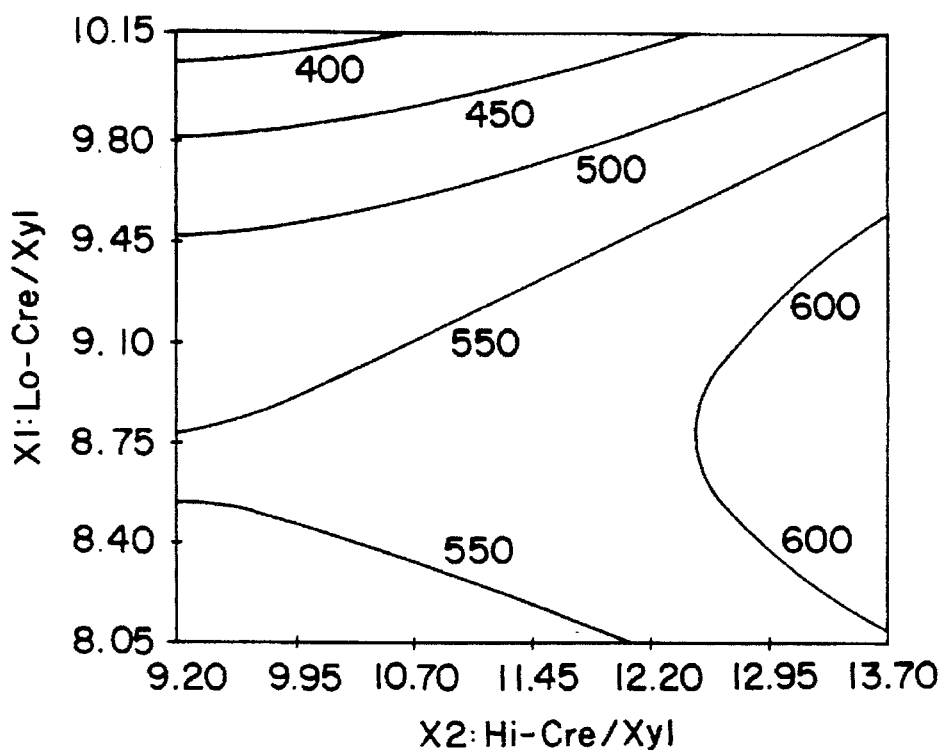

The second response measured for the twenty novolac blends, Examples 29–48 was their lithographic performance. Lithographic performance of the photoresists was measured as in example 49. The areas on the wafers of retained photoresist for the twenty photoresist samples from the blended novolacs were used to generate the response surfaces in FIGS. 3a, 3b and 3c. The surfaces have unusual and unexpected shapes. The optimal lithographic performance is on the central right edge of the cube. The poorer performing blends are in the upper left edge of the cube.

Figure 4:
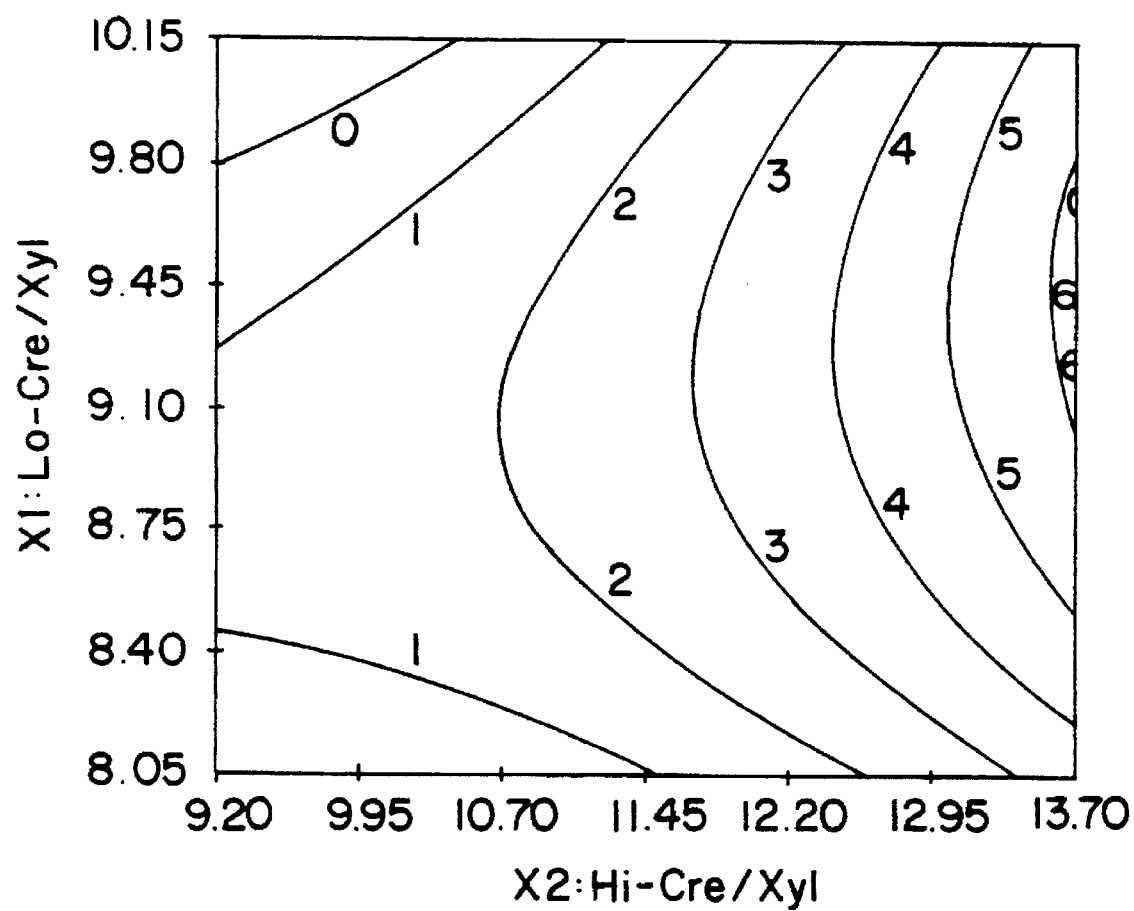

When the DR surface (FIG. 2b) is compared to the lithographic surface (FIG. 3b), it is apparent that the DR's are not directly related to lithographic performance. However, the one combination of RMW's and DR's that gave a surprisingly good match with experiment was $(RMW_A - RMW_B) + (DR_A - DR_B)$. That is, the best lithographic performance is obtained when the RMWs of the novolacs are most different but equally important is that they have similar dissolution rates. The theoretical response surface of $(MW_A-MW_B)+(DR_A-DR_B)$ is shown in FIG. 4. The very good match strongly supports the fact that optimal lithographic performance is achieved by blending novolacs with widely different RMW but similar DR's.

We claim:

1. A positive photoresist composition comprises an admixture of:
   a) a photosensitive component in an amount sufficient to uniformly photosensitize the photoresist composition; and
   b) a water insoluble, aqueous alkali soluble novolak resin blend "wherein the lithographic performance, L, equals $RMW_a-RMW_b$ and L is greater than or equal to 2.0," comprising providing a mixture of two novolak resins, with the same or different chemical composition, relative molecular weights (RMW) that differ by more than about 5% and dissolution rates DR that differ by less than 2.0; and
   c) a suitable solvent.

2. The photoresist composition of claim 1 wherein the relative molecular weights of the two novolak resins differ by more than about 10%.

3. The photoresist composition of claim 1 wherein the relative molecular weights of the two novolak resins differ from about 10% to about 60%.

4. The photoresist composition of claim 1 wherein the relative molecular weights of the two novolak resins differ from about 25% to about 50%.

5. The photoresist composition of claim 1 wherein the dissolution rates of the two novolak resins differ by less than about 1.5.

6. The photoresist composition of claim 1 wherein the dissolution rates of the two novolak resins differ by less than about 1.0.

7. The photoresist composition of claim 1 wherein the dissolution rates of two novolak resins differ by less than about 0.5.

8. The photoresist composition of claim 1 wherein L is greater than or equal to 4.0.

9. The photoresist composition of claim 1 wherein L is greater than or equal to 6.0.

10. The photoresist composition of claim 1 wherein L is greater than or equal to 8.0.

11. The photoresist composition of claim 1 wherein said photosensitive component is an ester of an alcoholic or phenolic residue and a sulfonic acid or sulfonic acid derivative.

12. The photoresist composition of claim 1 wherein said solvent is selected from the group consisting of propylene glycol mono-alkyl ether, propylene glycol alkyl ether acetate, butyl acetate, xylene, ethylene glycol monoethyl ether acetate, ethyl lactate, ethyl-3-ethoxypropionate, and mixtures of ethyl lactate and ethyl-3-ethoxypropionate.

13. The photoresist composition of claim 1 wherein said solvent is propylene glycol monomethyl ether acetate.

14. A method for producing a semiconductor device by producing a photoresist image on a substrate by coating a suitable substrate with a positive working photoresist composition which composition comprises an admixture of:
   a) a photosensitive component in an amount sufficient to photosensitize the photoresist composition; and
   b) a water insoluble, aqueous alkali soluble novolak resin blend comprising a mixture of two novolak resins, having the same or different chemical composition, relative molecular weights that differ by more than 5% and dissolution rates that differ by less than 2.0; and
   c) a suitable solvent; and
   d) heat treating the coated substrate until substantially all of the solvent is removed; image-wise exposing the photosensitive composition; and removing the image-wise exposed areas of such composition with an aqueous alkaline developer.

15. The photoresist composition of claim 14 wherein the lithographic performance, L, equals $RMW_a-RMW_b/DR_a-DR_b$ and L is greater than or equal to 2.0.

16. The process of claim 14 wherein the relative molecular weights of the two novolak resins differ by more than about 10%.

17. The process of claim 14 wherein the relative molecular weights of the two novolak resins differ from about 10% to about 60%.

18. The process of claim 14 wherein the relative molecular weights of the two novolak resins differ from about 25% to about 50%.

19. The process of claim 14 wherein the dissolution rates of the two novolak resins differ by less than about 1.5.

20. The process of claim 14 wherein the dissolution rates of the two novolak resins differ by less than about 1.0.

21. The process of claim 14 wherein the dissolution rates of two novolak resins differ by less than about 0.5.

22. The process of claim 15 wherein L is greater than or equal to 4.0.

23. The process of claim 15 wherein L is greater than or equal to 6.0.

24. The process of claim 15 wherein L is greater than or equal to 8.0.

25. The method of claim 14 wherein said photosensitive component is an ester of an alcoholic or phenolic residue and a sulfonic acid or sulfonic acid derivative.

26. The method of claim 14 wherein said solvent is selected from the group consisting of propylene glycol mono-alkyl ether, propylene glycol alkyl ether acetate, butyl acetate, xylene, ethylene glycol monoethyl ether acetate, ethyl lactate, ethyl-3-ethoxypropionate, and mixtures of ethyl lactate and ethyl-3-ethoxypropionate.

27. The method of claim 14 wherein said solvent is propylene glycol monomethyl ether acetate.

* * * * *